(12) United States Patent
Imonigie et al.

(10) Patent No.: US 10,978,306 B2
(45) Date of Patent: Apr. 13, 2021

(54) SEMICONDUCTOR RECESS FORMATION (71) Applicant: Micron Technology, Inc., Boise, ID (US)

(72) Inventors: Jerome A. Imonigie, Boise, ID (US); Adriel Jebin Jacob Jebaraj, Boise, ID (US); Brian J. Kerley, Boise, ID (US); Sanjeev Sapra, Boise, ID (US); Ashwin Panday, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 16/369,797

(22) Filed: Mar. 29, 2019

(65) Prior Publication Data

US 2020/0312954 A1  Oct. 1, 2020

(51) Int. Cl.
| | | |
|---|---|---|
| *H01L 21/306* | (2006.01) | |
| *H01L 49/02* | (2006.01) | |
| *H01L 21/311* | (2006.01) | |
| *H01L 27/108* | (2006.01) | |
| *H01L 21/3213* | (2006.01) | |
| *H01L 21/8234* | (2006.01) | |
| *H01L 21/8238* | (2006.01) | |
| *H01L 21/02* | (2006.01) | |
| *H01L 21/302* | (2006.01) | |

(52) U.S. Cl.
CPC .. *H01L 21/30604* (2013.01); *H01L 21/02211* (2013.01); *H01L 21/302* (2013.01); *H01L 21/31111* (2013.01); *H01L 21/31116* (2013.01); *H01L 21/32135* (2013.01); *H01L 21/823487* (2013.01); *H01L 21/823821* (2013.01); *H01L 27/10861* (2013.01); *H01L 27/10879* (2013.01); *H01L 28/92* (2013.01)

(58) Field of Classification Search
CPC ..... H01L 21/823431; H01L 21/823462; H01L 21/823468; H01L 21/823481; H01L 21/823487; H01L 21/823821; H01L 21/823857; H01L 21/823864; H01L 21/845; H01L 27/0886; H01L 27/0924; H01L 27/10879; H01L 27/1211; H01L 29/41791; H01L 29/66772; H01L 29/66795; H01L 29/785
See application file for complete search history.

(56) References Cited

U.S. PATENT DOCUMENTS

| | | | |
|---|---|---|---|
| 6,638,813 B1 * | 10/2003 | Tzeng | H01L 27/11 257/E21.011 |
| 7,271,045 B2 * | 9/2007 | Prince | H01L 21/31111 257/E21.251 |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 10,497,715 B2 * | 12/2019 | Kim | H01L 29/7926 |

(Continued)

*Primary Examiner* — Eduardo A Rodela
(74) *Attorney, Agent, or Firm* — Brooks, Cameron & Huebsch, PLLC (57) ABSTRACT

Methods, apparatuses, and systems related to forming a recess in a semiconductor structure are described. An example method includes etching the semiconductor structure using an elevated temperature dilution of acid and water. The method further includes etching the semiconductor structure using a room temperature wet etch of acid and water and a surface modification chemistry.

13 Claims, 8 Drawing Sheets

(56) References Cited

U.S. PATENT DOCUMENTS

| | | | |
|---|---|---|---|
| 2006/0056228 A1* | 3/2006 | Schloesser | H01L 27/10873 365/149 |
| 2012/0267683 A1* | 10/2012 | Kronholz | H01L 29/6653 257/192 |
| 2013/0234216 A1* | 9/2013 | Chou | H01L 21/823807 257/288 |

* cited by examiner

SEMICONDUCTOR RECESS FORMATION

TECHNICAL FIELD

The present disclosure relates generally to semiconductor devices and methods, and more particularly to formation of a semiconductor recess.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device. As an example, a capacitor material may be deposited into these openings to store and access data.

In order to increase the capacitance of a cell of the memory device, a surface area of the capacitor material formed into a column may be increased by increasing the height of the capacitor material column within the opening with various photolithographic and dry etching techniques. The surface area of the capacitor material may also be increased by reducing the width of the capacitor material column within the opening. However, due to possible gap margins and smaller pitch, increasing the height of a capacitor column may increase the risk of bulges or wider protruding features on a capacitor support pillar which may mask other materials within the capacitor support pillar and may reduce the opening available for capacitor materials.

In order to mitigate this issue, a method for etching the bulges using a wet etch as described further below. As an example, a bulge may occur at a silicon layer of the capacitor support pillar. A wet etch that includes a dilution of acid and water may be used to selectively etch the silicon dielectric bulge without affecting other materials within the capacitor support pillar. The capacitor support pillar may include layers of silicon, metal, nitride, and/or oxide materials. The dilution may be an elevated temperature combination of water and an acid. The etch may result in a straighter capacitor support pillar and increased space within the opening to deposit capacitor materials.

The present disclosure includes methods, apparatuses, and systems related to forming a semiconductor recess. An example of a method described herein includes etching a semiconductor structure using an elevated temperature dilution of acid and water. The example method further includes etching the semiconductor structure using a room temperature process uses acid and water and a silane-based surface modification chemistry to selectively etch the silicon dielectric bulge without affecting the other materials within the capacitor support pillar.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 118 may reference element "18" in FIG. 1B, and a similar or same element may be referenced as 118 in FIG. 1C. In some instances, a plurality of similar, but functionally and/or structurally distinguishable, elements or components in the same figure or in different figures may be referenced sequentially with the same element number (e.g., 101-1, 101-2).

Figure 1A:
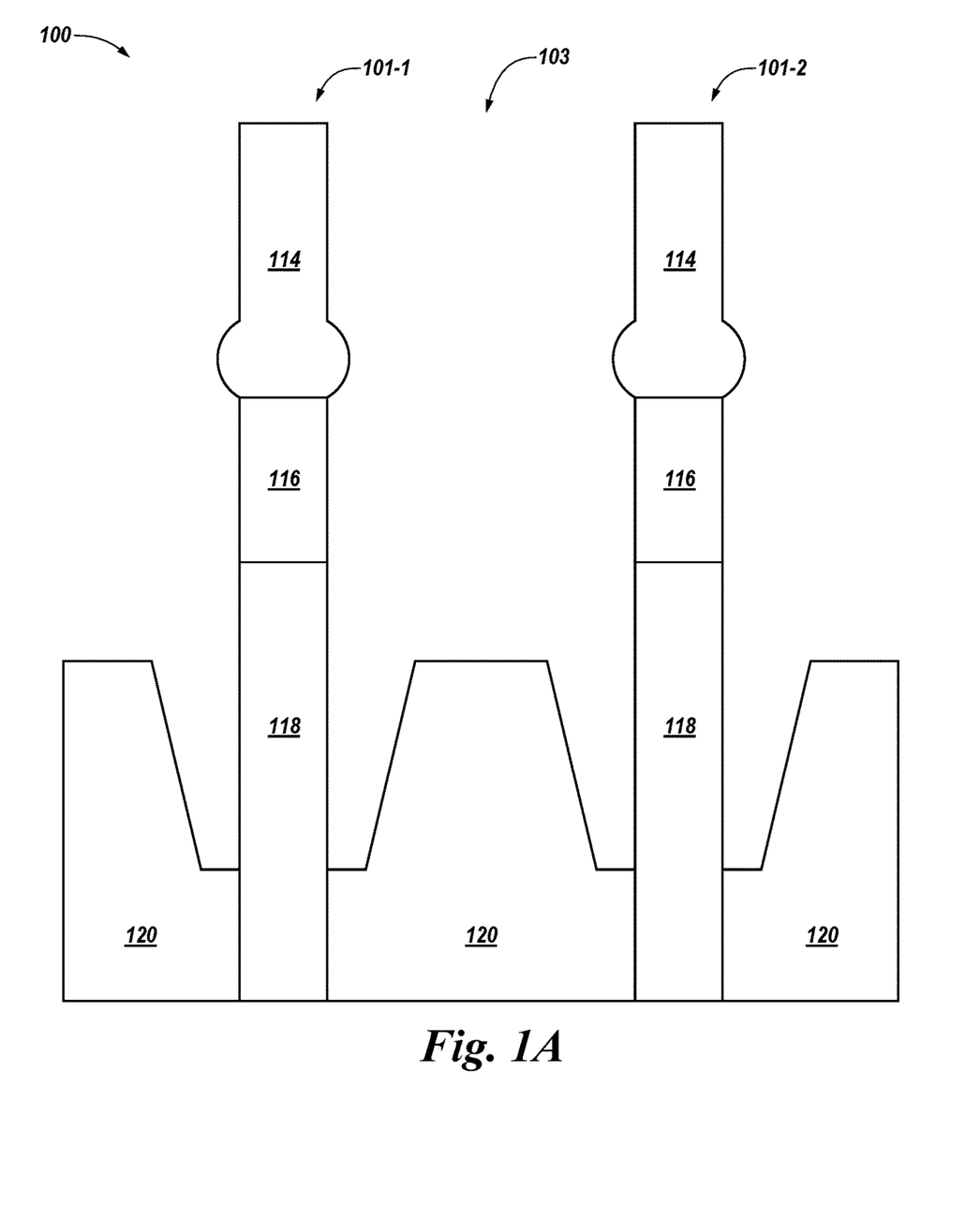
FIGS. 1A-D illustrate cross-sectional views of a portion of a memory device in different examples of the semiconductor fabrication sequence for formation of a semiconductor recess in accordance with a number of examples of the present disclosure.

FIG. 1A illustrates a cross-sectional view 100-1 of a portion of an example memory device in another example of the semiconductor fabrication sequence for forming a semiconductor recess in accordance with a number of examples of the present disclosure. The example memory device 100-1 may include a number of capacitor support pillars 101-1, 101-2 (hereinafter referred to collectively as capacitor support pillars 101) which may each be comprised of a first silicon-based material 118 (shown to have been formed into an underlying substrate material 120), a metal material 116, and/or a second silicon-based material 114. The substrate material 120 may be formed from various undoped or doped dielectric materials on which memory device materials may be fabricated. Examples of a substrate material 120 may include silicon-based oxides, among other possibilities.

The first silicon-based material 118 may, in a number of examples, be an oxidized silicon ($SiO_2$) material. In some examples, first silicon-based material 118 may be formed from polycrystalline silicon (polysilicon), among other possibilities. The first silicon-based material 118 may also be formed from a semiconducting material. The first silicon-based material 118 may be originally formed (e.g., deposited) within the underlying substrate material 120 by dry etching through a photo pattern. For example, the first silicon-based material 118 may be formed from the bottom of the underlying substrate material 120 to a height 50-60 nm above the underlying substrate material 120. In some examples, the first silicon-based material 118 may be a different silicon-based material than the substrate material 120. In other examples, the first silicon-based material 118 can be a combination of layers of silicon-based materials (as an example, two layers of silicon-based material, three layers of silicon-based material, etc).

A metal material 116 may be formed (e.g., deposited), as is shown, on a surface of the first silicon-based material 118 opposite from the underlying substrate material 120. For example, the metal material 116 may be formed on the top of the first silicon-based material 118 to a particular height approximately 24-30 nm above the underlying substrate material 120 or dry etched through a photo pattern to form on top of material 118. In one example, the metal material 116 may be formed from tungsten (W). In another example, the metal material 116 may be formed from other transition metals such as rhenium (Re), osmium (Os), iridium (Ir), platinum (Pt), titanium (Ti), zirconium (Zr), chromium (Cr), ruthenium (Ru), and palladium (Pd), among other possibilities. The metal material 116 may be oxidized.

Similar to the first silicon-based material 118, a silicon-based material 114 may be formed on a surface of the metal material 116 opposite the first silicon-based material 118. Put another way, the second silicon-based material 114 may be formed (e.g., deposited) on an upper surface of the metal material 116. In one example, the second silicon-based material 114 may be doped with a nitride to form a silicate nitride (SiNx) material. In another example, the second silicon-based material 114 may be doped with an oxide and a nitride to form a silicon in oxynitride (SiON) material. In a number of examples, the second silicon-based material 114 may be formed from a dielectric material.

A dry etch process may be utilized to etch through the second silicon-based material 114, the metal material 116, and/or parts of the first silicon-based material 118 to form an opening 103 within the previously listed materials (as is illustrated between plurality of pillars 101-1 and 101-2, hereinafter referred to collectively as plurality of pillars 101). Each of the plurality of pillars 101 may include a first silicon-based material 118 formed into the underlying substrate material 120, the metal material 116, and the second silicon-based material 114, as illustrated. The opening 103 may be used as a column for capacitor materials. The opening 103 may extend from a top of the surface of the second silicon-based material 114 to the surface of the underlying substrate material 120.

In at least one example, the width or diameter of the opening 103 between plurality of pillars 101-1 and 101-2 may be within a range of approximately 200-600 Angstroms (or 20 to 60 nm) and the height of the opening 103 may be within a range of approximately 8,000-15,000 Angstroms (800-1,500 nm) and may result in an aspect ratio (AR) of the height to width being in a range of approximately 25:1 to approximately 50:1 as the etch progresses through the second silicon-based material 114 and approaches the substrate material 120. As the height of the plurality of pillars 101 increases, a bending and/or leaning of the plurality of pillars 101 may occur.

The dry etch process used to form the plurality of pillars 101 goes through the first silicon-based material 118, the metal material 116, and the second silicon-based material 114. The dry etching through the dissimilar materials may result in a bulge in the second silicon-based material 114. The bulge 115 may be a wider protruding feature formed on the second silicon-based material 114. In one example, the bulge 115 may be on one pillar (101-1 or 101-2) but not on the other pillar (101-2 or 101-1, respectively). The bulge 115 may mask the features of the other materials within the plurality of pillars 101. The bulge 115 may protrude into the opening 103, reducing the space and/or volume for the capacitor materials.

Figure 1B:
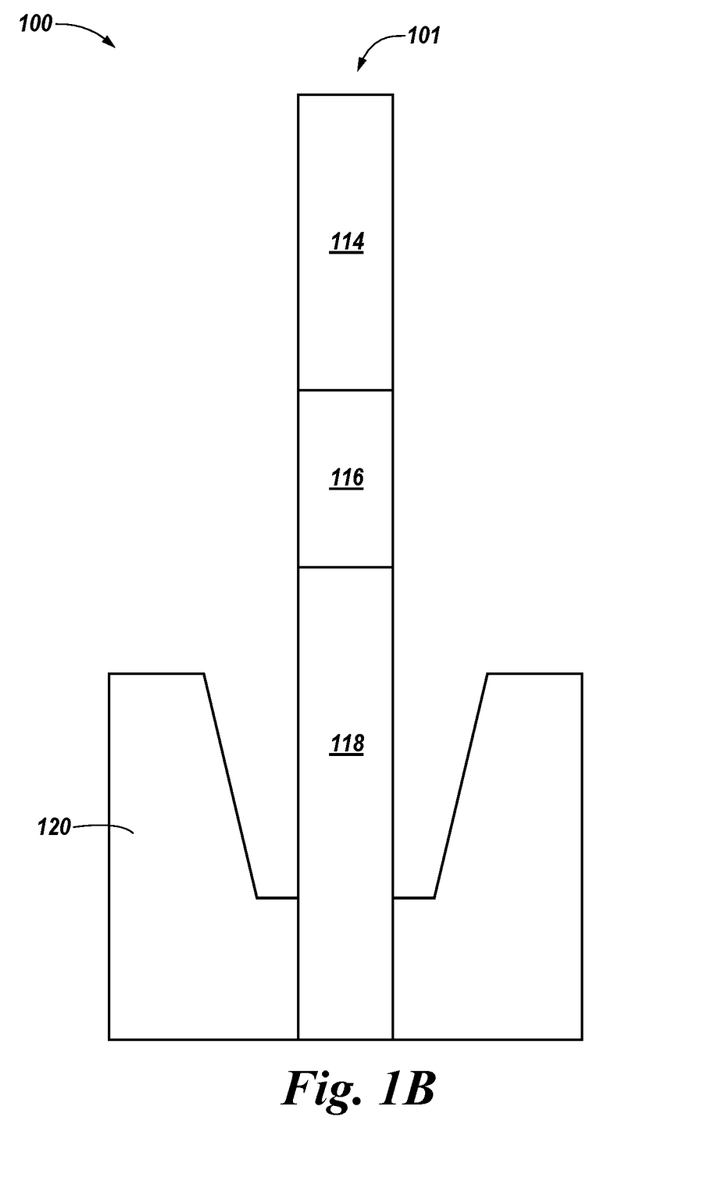

FIG. 1B illustrates a cross-sectional view 100-2 of a portion of an example memory device in an example of the semiconductor fabrication sequence for forming a semiconductor recess in accordance with a number of examples of the present disclosure. FIG. 1B illustrates a structure of the portion of the example memory device at the particular stage following completion of the example fabrication sequence described in connection with FIG. 1A.

A sequence of wet etch processes may be used to remove the bulge (e.g., bulge 115 as illustrated in FIG. 1A) on the plurality of pillars 101. The wet etch process sequence may create a recess by removing the bulge. That is, the recess of the bulge 115 may provide for a wider, more uniform opening space in an opening (such as opening 103 as illustrated in FIG. 1A). The recess of the bulge 115 may result in increased space to deposit capacitor materials. The wet etch process sequence may include etching the semiconductor structure using an elevated temperature dilution of acid and water and then etching the semiconductor structure using a room temperature wet etch of acid and water and a silane-based surface modification chemistry. The surface modification chemistry may consist of hexamethyldisilazane (HMDS).

As is described, there may be two groups of etching: wet/vapor etching at elevated temperature and wet/vapor etching at room temperature using a silane-based surface modification chemistry HMDS treatment. Wet etching may remove materials by immersing the materials in a chemical solution that reacts with selected films to form soluble by-products. Vapor etching may dissolve materials using reactive gaseous molecules in a gas phase. It may utilize vapor instead of liquid etchants to remove the materials.

The wet etch sequence may result in a straighter opening and an increased space for the capacitor materials. The elevated temperature etch process may selectively target the silicon-based material layer 114 of the plurality of pillars 101 (represented by the singular capacitor support pillar 101) where the bulge has formed without targeting the metal material 116 or the other silicon-based material 118. The first wet etch dilution may etch the silicon-based material 114 using an elevated temperature dilution. The second wet etch may be a room temperature wet etch to make the plurality of pillars 101 hydrophobic.

Figure 1C:
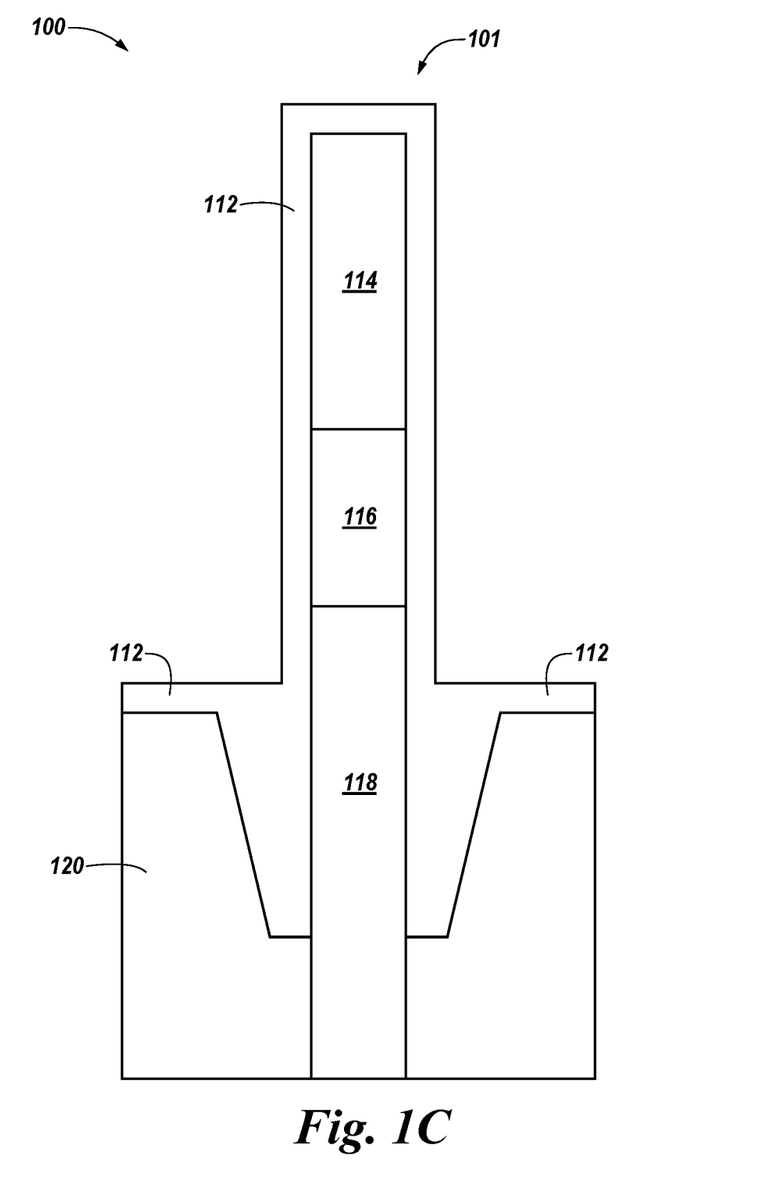

FIG. 1C illustrates a cross-sectional view 100-3 of a portion of an example memory device in an example of the semiconductor fabrication sequence for forming a semiconductor recess in accordance with a number of examples of the present disclosure. FIG. 1C illustrates a structure of the portion of the example memory device at the particular stage following completion of the example fabrication sequence described in connection with FIGS. 1A and 1B.

Subsequent to formation of the recess as described in association with FIG. 1B, a nitride material 112 may be formed over the first silicon-based material 118, the metal material 116, and the second silicon-based material 114. The nitride material 112 may be a spacer nitride. The nitride material 112 may be used to protect the materials (the first silicon-based material 118, the metal material 116, and the second silicon-based material 114) beneath the nitride material 112 during a subsequent processing sequence. The nitride material 112 may be selected for dielectric or resistance properties. For example, one or more dielectric and/or resistor nitrides may be selected from boron nitride (BN), silicon nitride (SiNx, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the nitride material 112. The nitride material may be formed from the same material as the first silicon-based material 118. The nitride material may be formed from the same material as the second silicon-based material 114

The nitride material 112 may be formed over the etched plurality of pillars 101. The nitride material 112 may be formed over the pillar of materials 101. The nitride material 112 may take on the shape of the plurality of pillars 101 beneath. That is, the etched plurality of pillars 101 have a straight profile which the nitride material 112 can assume.

Figure 1D:
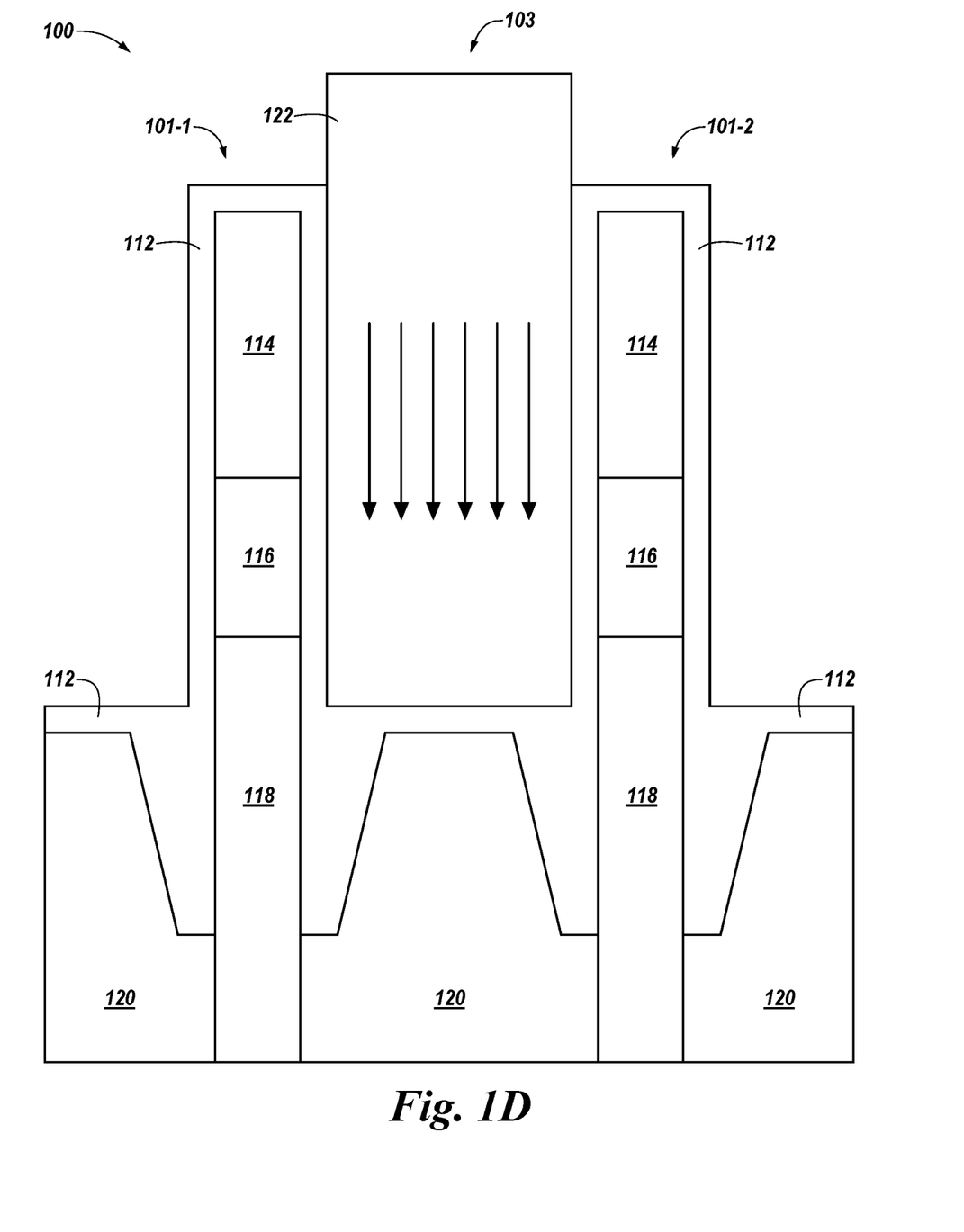

FIG. 1D illustrates a cross-sectional view 100-4 of a portion of an example memory device in an example of the semiconductor fabrication sequence for forming a semiconductor recess in accordance with a number of examples of the present disclosure. FIG. 1D illustrates a structure of the portion of the example memory device at the particular stage following completion of the example fabrication sequence described in connection with FIGS. 1A, 1B, and 1C.

The straighter profile of the plurality of pillars 101 may improve a subsequent dry etch margin. With the bulge still intact, a dry etch may be unable to access the corners of the top of the nitride material 112, where the plurality of pillars 101 may connect to the top of the substrate material 120. Removing the bulge may increase the dry etch margin and provide for a straighter pillar profile. A dry etch 122 may access regions of the plurality of pillars 101 that were previously inaccessible such as the entirety of the top of the nitride material 112.

Figure 2:
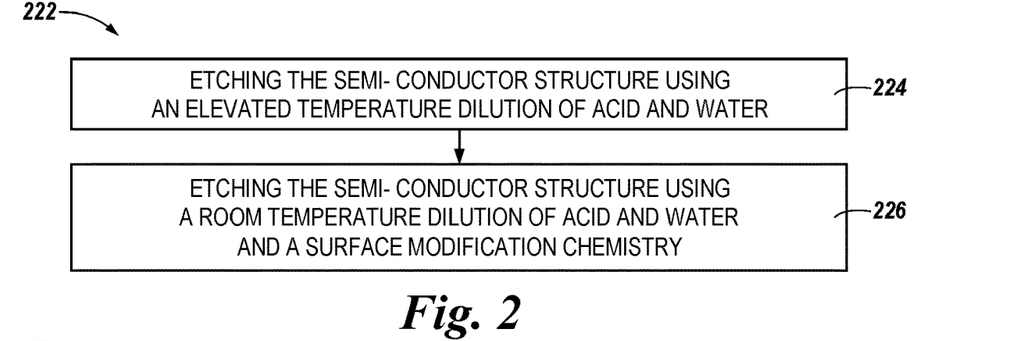
FIGS. 2-4 illustrates flow diagrams of example methods for formation of a semiconductor recess in accordance with a number of examples of the present disclosure.

FIG. 2 illustrates a flow diagram of an example method 222 for formation of a semiconductor recess in accordance with a number of examples of the present disclosure. The method 222 is a detailed explanation of the etch process that creates the resultant pillar in FIG. 1B. That is, the method 222 to form a recess in a semiconductor structure details the formation of the recess by removal of the bulges from the plurality of pillars (e.g., pillars 101).

At block 224, the method 222 may include etching the semiconductor structure using an elevated temperature dilution of acid and water. The elevated temperature dilution may comprise a ratio of approximately 2000 parts of water to approximately 1 part acid (2000:1). The acid may be a hydrofluoric acid. The water may be deionized water. The dilution may have an elevated temperature ranging from 60 to 75 degrees Celsius. The elevated temperature dilution may be used during a wet etch process. The elevated temperature dilution may be used to selectively etch the silicon bulge without affecting the other materials within the capacitor support pillar. That is, the elevated temperature dilution may etch both the overlaying nitride material and the silicon-based material beneath without affecting the other silicon-based or metal materials within the capacitor support pillar.

At block 226, the method 222 may include etching the semiconductor structure using a room temperature wet etch using acid and water and a surface modification chemistry. That is, the room temperature wet etch may consist of an acid, water, and a surface modification chemistry. The room temperature wet etch may comprise a ratio of approximately 300 parts of water to approximately 1 part acid (300:1). The acid may be a hydrofluoric acid. The water may be deionized water. The room temperature may range from 20 to 25 degrees Celsius. The room temperature wet etch may be the second step within the wet etch sequence and may occur after the elevated temperature etch. Block 226 may occur after block 224. That is, the room temperature wet etch may be applied to the plurality of pillars after the elevated temperature dilution has been applied. The room temperature wet etch may include a surface modification chemistry. The surface modification chemistry may prevent the semiconductor structure from toppling during the etch process and may turn the surface of the semiconductor structure hydrophobic. That is, the materials within capacitor support pillars may be hydrophobic after the room temperature wet etch.

Figure 3:
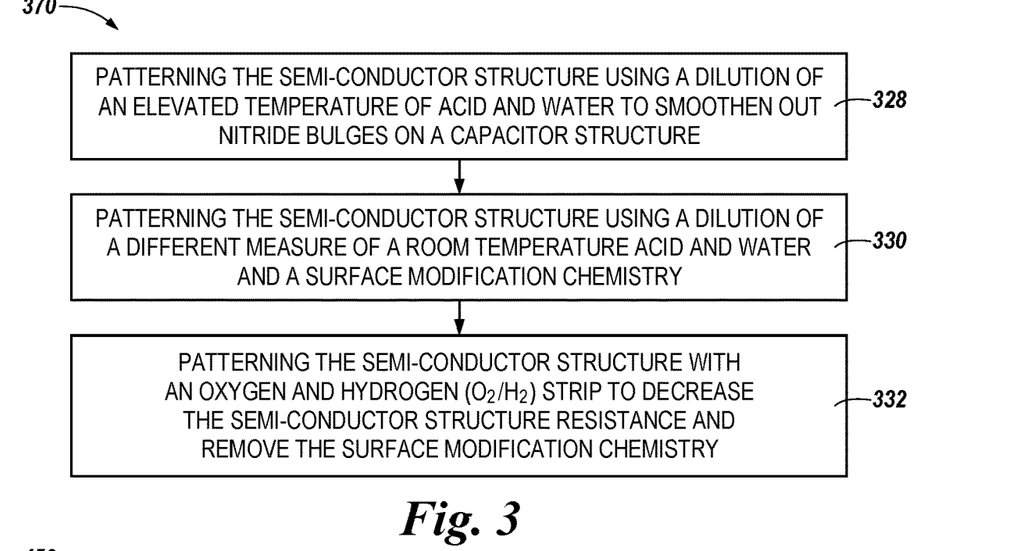

FIG. 3 is a flow diagram of an example method 370 for formation of a semiconductor recess in accordance with a number of examples of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 328, the method 370 may include patterning the semiconductor structure using a dilution of an elevated temperature of acid and water to smooth out nitride bulges on a capacitor structure. That is, the dilution of an elevated temperature of acid and water may be used to pattern out the nitride bulges on the capacitor support pillar. The elevated temperature dilution may etch both the overlaying nitride material and the silicon-based material beneath without affecting the other silicon-based or metal materials within the capacitor support pillar. That is, the elevated temperature dilution may be used to selectively etch the silicon bulge without affecting the other materials within the capacitor support pillar.

At block 330, the method 370 may include patterning the semiconductor structure using a dilution of a room temperature acid and water and a surface modification chemistry. The room temperature wet etch may be used to pattern the semiconductor structure after patterning the semiconductor structure with the elevated temperature dilution. That is, the capacitor support pillar may be etched using the elevated temperature dilution and subsequently etched using the room temperature wet etch. The room temperature wet etch may be used to turn the surface of the semiconductor structure hydrophobic. That is, the materials within capacitor support pillars may be hydrophobic after the room temperature wet etch.

At block 332, the method 370 may include patterning the semiconductor structure with a reducing strip to decrease the semiconductor structure resistance and remove the surface modification chemistry. The room temperature wet etch referred to in association with block 332 may render the capacitor support pillars hydrophobic. The reducing strip may be used to remove the surface modification chemistry after the wet etch sequence is over. The step at block 332 of method 370 may occur after the step at block 330 of method 370. That is, the reducing strip may be applied to the capacitor support pillars after the room temperature etch has been applied. The surface modification chemistry may be used to prevent the semiconductor structure from toppling during the wet etch sequence and to turn the surface of the semiconductor structure hydrophobic. The reducing strip may be used to remove the hydrophobic effects of the surface modification chemistry. The reducing strip may also be used to decrease the semiconductor resistance and to reduce the oxidized metal to elemental metal. In one example, the reducing strip may be formed from Oxygen and Hydrogen ($O_2/H_2$). In another example, the reducing strip may be formed from Oxygen and Ammonia ($O_2/NH_3$). In some examples, the reducing strip may be formed from pure Hydrogen ($H_2$).

Figure 4:
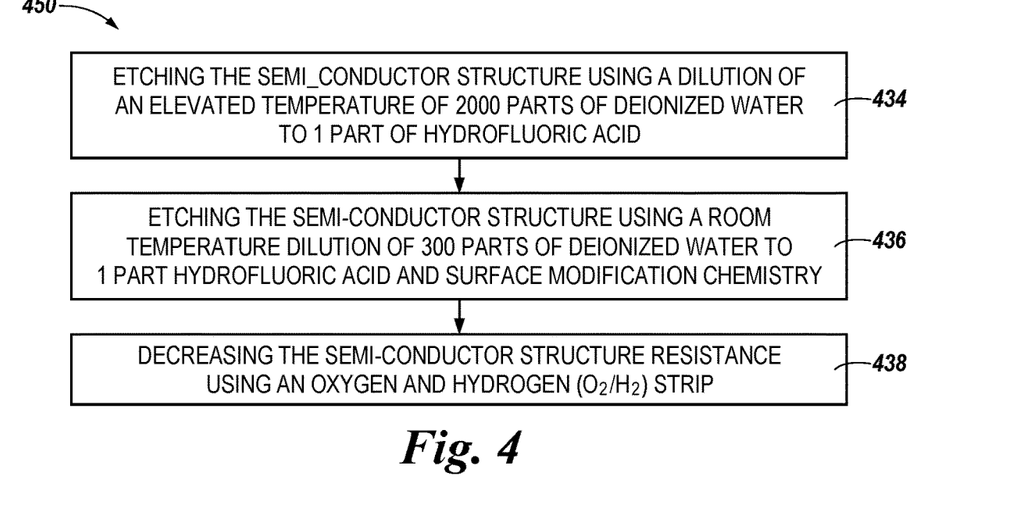

FIG. 4 illustrates a flow diagram of an example method 450 for formation of a semiconductor recess in accordance with a number of examples of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 434, the method 450 may include etching the semiconductor structure using a dilution of an elevated temperature of approximately 2000 parts of deionized water to approximately 1 part hydrofluoric acid. The dilution may have an elevated temperature ranging from 60 to 75 degrees Celsius. The elevated temperature dilution may be used as a wet etch. The elevated temperature dilution may be used to selectively etch the silicon bulge without affecting the other materials within the capacitor support pillar. That is, the elevated temperature dilution may etch both the overlaying nitride material and the silicon-based material beneath without affecting the other silicon-based or metal materials within the capacitor support pillar.

At block 436, the method 450 may include etching the semiconductor structure using a room temperature wet etch of approximately 300 parts of deionized water to approximately 1 part hydrofluoric acid and surface modification chemistry. That is, the room temperature wet etch may consist of hydrofluoric acid, deionized water and a surface modification chemistry. The etch may use room temperatures ranging from 20 to 25 degrees Celsius. The room temperature wet etch may include a surface modification chemistry. The surface modification chemistry may prevent the semiconductor structure from toppling during the etch process and to turn the surface of the semiconductor structure hydrophobic.

At block 438, the method 450 may include decreasing the semiconductor structure resistance using a reducing strip. The room temperature wet etch of block 436 may render the capacitor support pillars hydrophobic. A reducing strip may be used to remove the surface modification chemistry after the etch processes are over. That is, the reducing strip may be used to remove the hydrophobic effects of the surface modification chemistry. The reducing strip may also be used to decrease the semiconductor resistance and to reduce the oxidized metal material to elemental metal material. The metal material may be oxidized by the dry etch process used to form the plurality of pillars.

Figure 5:
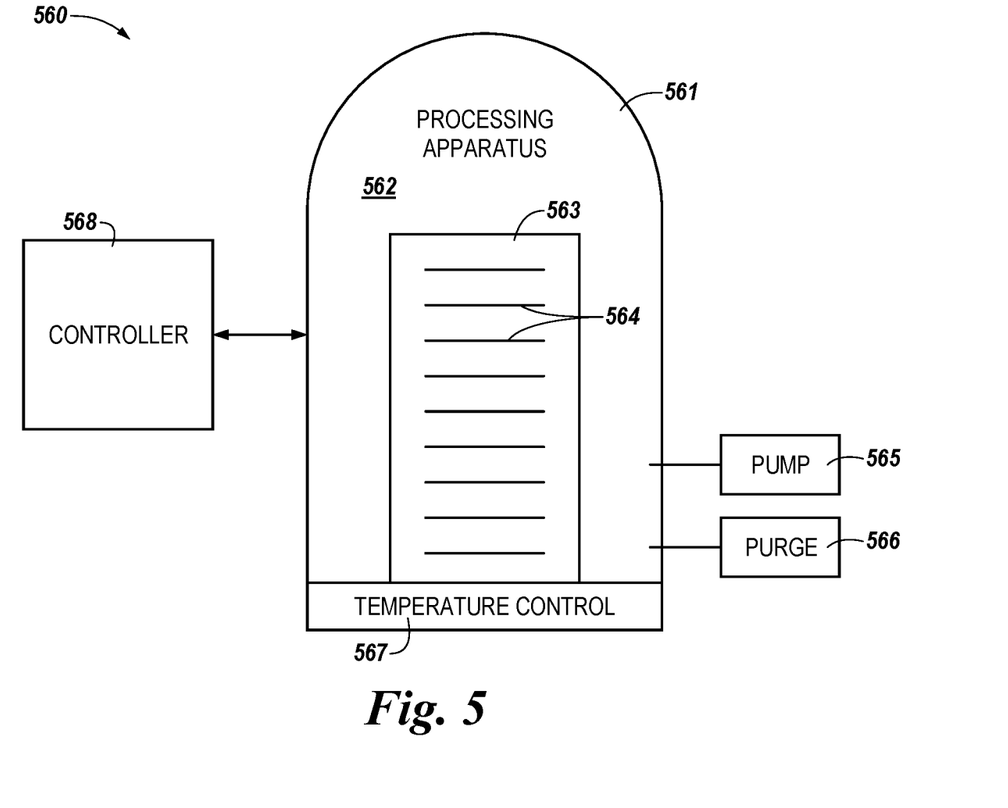
FIG. 5 is a functional block diagram of a system for implementation of an example semiconductor fabrication process in accordance with a number of embodiments of the present disclosure

FIG. 5 is a functional block diagram of a system 560 for implementation of an example semiconductor fabrication process in accordance with a number of embodiments of the present disclosure. The system 560 can include a processing apparatus 561. The processing apparatus 561 can be configured to enable formation of a semiconductor recess.

The processing apparatus 561 can include a semiconductor processing chamber 562 to enclose components configured to form a semiconductor recess. The chamber 562 can further enclose a carrier 563 to hold a batch of semiconductor wafers 564 (e.g., the substrate material 120). The processing apparatus 561 can include and/or be associated with tools including, for example, a pump 565 unit and a purge 566 unit configured to introduce and remove reducing agents. The processing apparatus 561 can further include a temperature control 567 unit configured to maintain the chamber 562 at appropriate temperatures as described herein.

The system 560 can further include a controller 568. The controller 568 can include, or be associated with, circuitry and/or programming for implementation of, for instance, formation of the semiconductor recess. Adjustment of such deposition and purging operations by the controller 568 can control the thickness of the materials described herein (the first silicon-based material, the metal, the second silicon-based material).

The controller 568 can, in a number of embodiments, be configured to use hardware as control circuitry. Such control circuitry may, for example, be an application specific integrated circuit (ASIC) with logic to control fabrication steps, via associated deposition and purge processes, for formation of a semiconductor recess.

Figure 6:
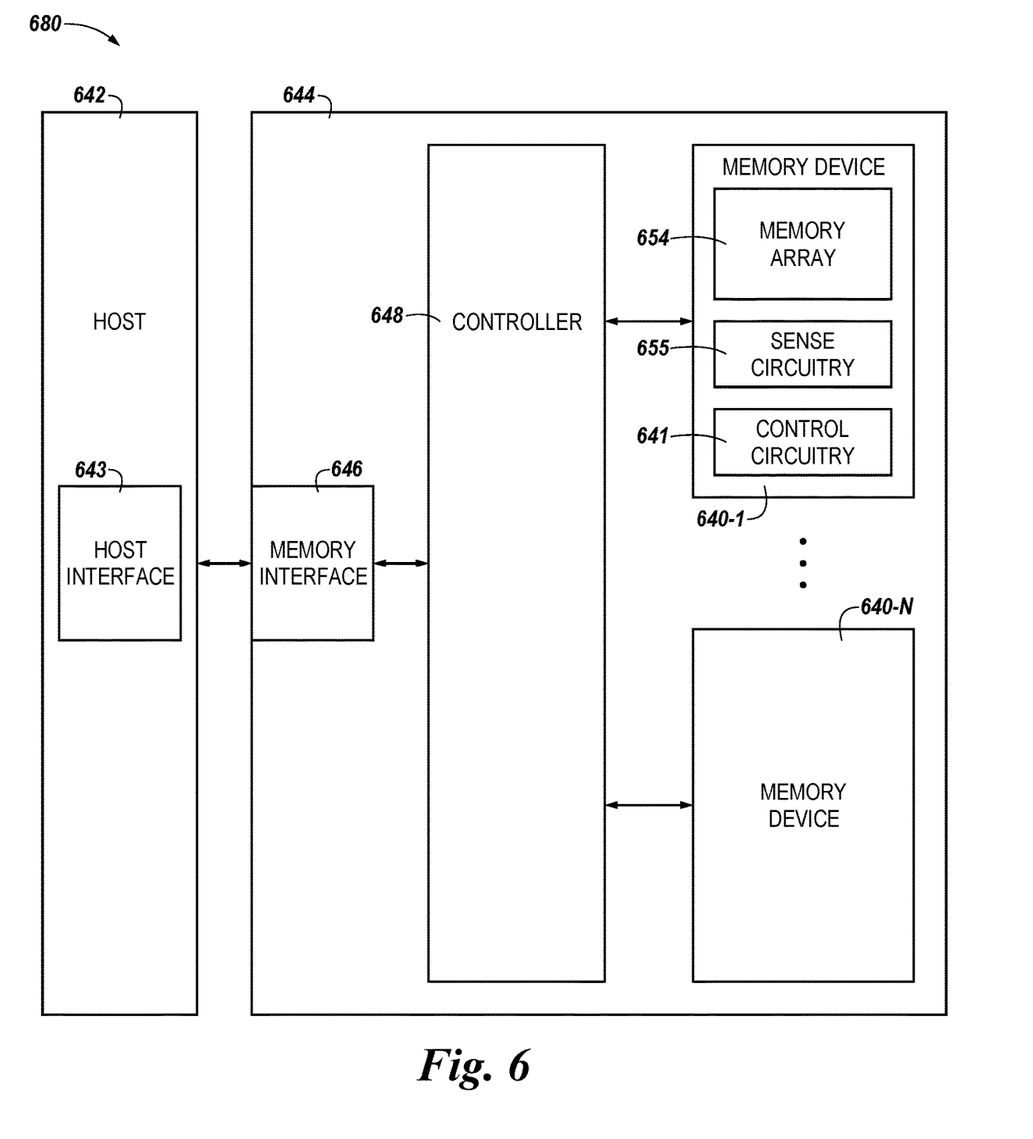
FIG. 6 illustrates a functional block diagram of a computing system including at least one memory array having a structure formed in accordance with one or more examples of the present disclosure.

FIG. 6 is a functional block diagram of a computing system 680 including at least one memory array having a structure formed in accordance with one or more examples of the present disclosure. The system 644 may be, for example, a solid-state drive (SSD).

In the example illustrated in FIG. 6, the system 644 includes a memory interface 646, a number of memory devices 640-1, . . . , 640-N, and a controller 648 selectably coupled to the memory interface 646 and memory devices 640-1, . . . , 640-N. Memory interface 646 may be used to communicate information between the system 644 and another device, such as a host 642. Host 642 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 602 may be associated with fabrication operations performed on semiconductor devices and/or SSDs using, for example, a processing.

In a number of examples, host 642 may be associated with (e.g., include or be coupled to) a host interface 643. The host interface 643 may enable input of scaled preferences (e.g., in numerically and/or structurally defined gradients) to define, for example, critical dimensions (CDs) of a final structure or intermediary structures of a memory device (e.g., as shown at 640) and/or an array of memory cells (e.g., as shown at 654) formed thereon to be implemented by the processing apparatus. The scaled preferences may be provided to the host interface 643 via input of a number of preferences stored by the host 642, input of preferences from another storage system (not shown), and/or input of preferences by a user (e.g., a human operator).

Memory interface 646 may be in the form of a standardized physical interface. For example, when the system 644 is used for information (e.g., data) storage in computing system 680, memory interface 646 may be a serial advanced technology attachment (SATA) interface, a peripheral component interconnect express (PCIe) interface, or a universal serial bus (USB) interface, among other physical connectors and/or interfaces. In general, however, memory interface 606 may provide an interface for passing control, address, information, scaled preferences, and/or other signals between the controller 648 of the system 644 and a host 642 (e.g., via host interface 643).

Controller 648 may include, for example, firmware and/or control circuitry (e.g., hardware). Controller 648 may be operably coupled to and/or included on the same physical device (e.g., a die) as one or more of the memory devices 640-1, . . . , 640-N. For example, controller 648 may be, or may include, an ASIC as hardware operably coupled to circuitry (e.g., a printed circuit board) including memory interface 646 and memory devices 640-1, . . . , 640-N. Alternatively, controller 648 may be included on a separate physical device that is communicatively coupled to the physical device (e.g., the die) that includes one or more of the memory devices 640-1, . . . , 640-N.

Controller 648 may communicate with memory devices 640-1, . . . , 640-N to direct operations to sense (e.g., read), program (e.g., write), and/or erase information, among other functions and/or operations for management of memory cells. Controller 648 may have circuitry that may include a number of integrated circuits and/or discrete components. In a number of examples, the circuitry in controller 648 may include control circuitry for controlling access across memory devices 640-1, . . . , 640-N and/or circuitry for providing a translation layer between host 642 and the system 644.

Memory devices 640-1, . . . , 640-N may include, for example, a number of memory arrays 654 (e.g., arrays of volatile and/or non-volatile memory cells). For instance, memory devices 640-1, . . . , 640-N may include arrays of memory cells, such as a portion of an example memory device 670 structured to include structures described in connection with FIG. 1A-1D. As will be appreciated, the memory cells in the memory arrays 654 of memory devices 640-1, . . . , 640-N and/or as shown at 776 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 640, 776 may be formed on the same die. A memory device (e.g., memory device 640-1) may include one or more arrays 654 of memory cells formed on the die. A memory device may include sense circuitry 555 and control circuitry 641 associated with one or more arrays 654 formed on the die, or portions thereof. The sense circuitry 655 may be utilized to determine (sense) a particular data value (e.g., 0 or 1) that is stored at a particular memory cell in a row of an array 654. The control circuitry 641 may be utilized to direct the sense circuitry 655 to sense particular data values, in addition to directing storage, erasure, etc., of data values in response to a command from host 642 and/or host interface 643. The command may be sent directly to the control circuitry 641 via the memory interface 646 or to the control circuitry 641 via the controller 648.

The example illustrated in FIG. 6 may include additional circuitry that is not illustrated so as not to obscure examples of the present disclosure. For example, memory devices 640, 776 may include address circuitry to latch address signals provided over I/O connectors through I/O circuitry. Address signals may be received and decoded by a row decoder and a column decoder to access a memory array 654. It will be appreciated that the number of address input connectors may depend on the density and/or architecture of memory devices 640, 776 and/or memory arrays 654.

Figure 7:
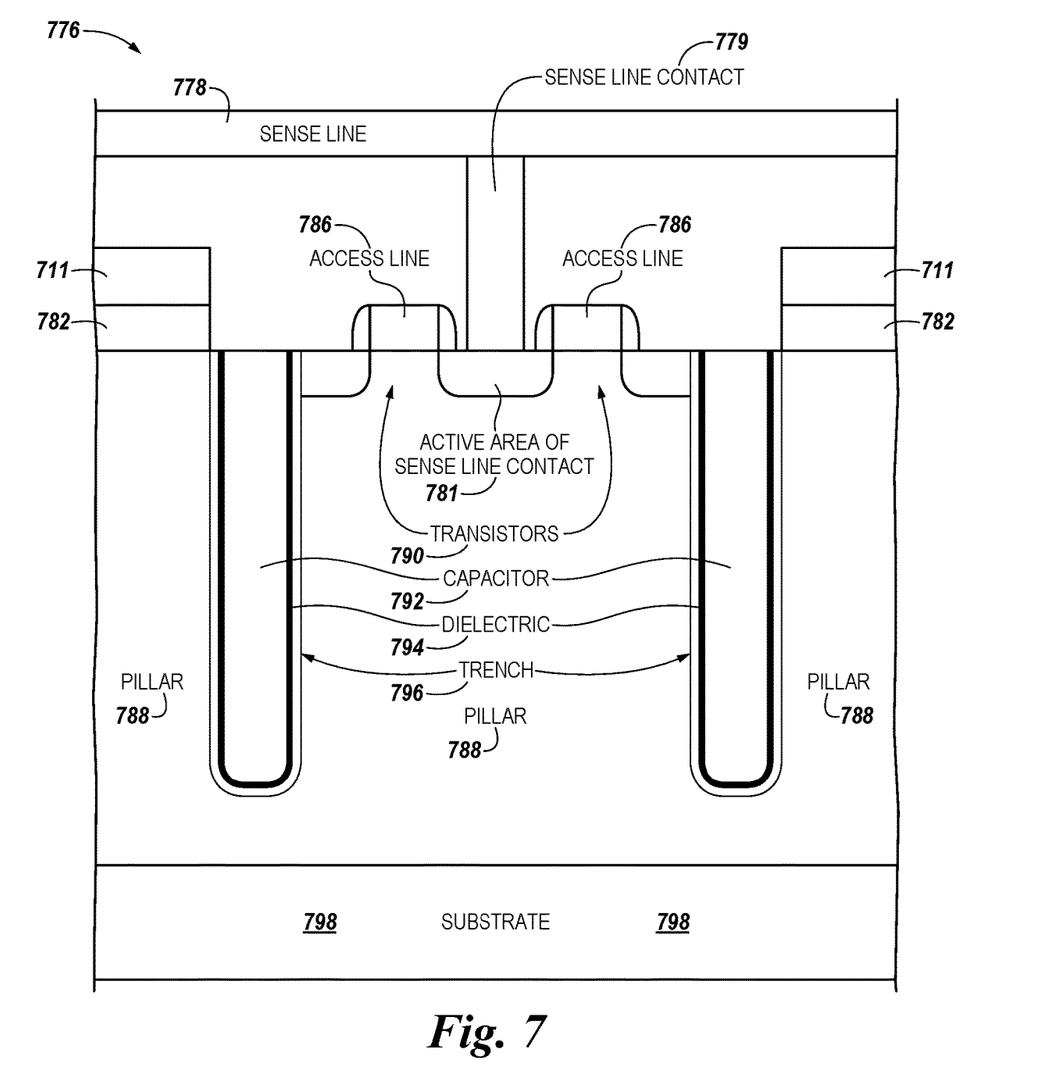
FIG. 7 illustrates a cross-sectional view of a portion of an example semiconductor structures of a memory device in accordance with a number of embodiments of the present disclosure.

FIG. 7 illustrates a cross-sectional view of a portion of an example of semiconductor structures of a memory device 776 that include a structure formed in accordance with a number of embodiments of the present disclosure. The portion of the memory device 776 illustrated in FIG. 7 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 790 and capacitors 792 are shown to be arranged in a lateral configuration, embodiments may include the transistors 790 and capacitors 692 being arranged in a lateral, a vertical, or any other configuration.

The portion of the memory device 776 shown in FIG. 7 may represent two DRAM memory cells in a 1T1C (one transistor one capacitor) configuration or one DRAM memory cell in a 2T2C configuration. DRAM memory cells may utilize capacitors 792 each formed in a trench 796 to store a particular charge corresponding to a data value. Forming the trenches 796 as shown in FIG. 7 may result in a pillar 788 being formed from the etched material on each side of a trench 796. Pillars 788 may be formed (e.g., fabricated) as layers of doped or undoped semiconductor material deposited on a substrate material 798. The semiconductor material may be etched to form the pillars 788 and trenches 796. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 796 may be etched to a particular depth into a pillar material. The trench 796 may be etched into the material of the pillars 788 to a depth approaching the substrate material 798, as shown in FIG. 7. Alternatively, the trench 796 may be etched into the material of the pillars 788 to a top of or into the substrate material 798. The depth of the trench 796 approaching, at the top of, and/or into the substrate material 798 is termed herein as being in the bottom region of the trench.

As described herein, deepening (e.g., etching) the trench further into the pillar material or the substrate material, formed according to embodiments described in FIGS. 1-5, may increase a surface area of the trench boundaries. In one example, increasing the surface area of the trench boundaries may increase a capacitance of a capacitor 792 formed in the trench 796 (e.g., by increasing a volume and/or surface area of the capacitor). In this example, the trench 796 may be lined with a dielectric material 794 and a capacitor material may be formed (e.g., deposited) within the trench 796 and on the dielectric material 794 to form the capacitor 792 to a particular (e.g., target) depth.

Each pillar 788 of the pillar material may extend to a particular height above the substrate material 798. As such, each pillar 788 has a top surface at the particular height. A number of structural materials may be formed on or in association with the top surface of the pillar 788 adjacent the trench 796. For example, a particular material 782 may be formed to contribute to data access, storage, and/or processing (e.g., conductor, resistor, and/or dielectric materials). Such a material 782 may be formed on the top surface of the pillar 788 adjacent the trench 796. A mask material 711 may be formed to protect an underlying material 782 and/or the top surface of the pillar 788 adjacent the trench 796 from subsequent processing and/or wear encountered in use of the memory device 776. Other structural materials that may be formed (e.g., in a DRAM configuration as shown in FIG. 6) on or in association with the top surface of the pillar 788 adjacent the trench 796. The other structural materials may include the transistors 790, access lines 786, and/or sense lines 778, and/or sense line contacts 779, among other possible structural materials. A region of contact between a sense line contact and the semiconductor material may be an active area 781 of the sense line contact. The active area 781 also may be associated with a number of access lines 786. The structural materials just described as being formed on and/or in association with the top surface of the pillar 788 adjacent the trench 796 are termed herein as being in a top region of the pillar 788 and/or trench 796.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, substrate materials, silicon-based materials, nitride materials, buffer materials, etch chemistries, etch processes, solvents, memory devices, memory cells, sidewalls of openings and/or trenches, among other materials and/or components related formation of a semiconductor recess have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to formation of a semiconductor recess than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in a single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed is:

1. A method comprising:
   patterning a silicon material within a semiconductor structure using a wet etch dilution of an elevated temperature of acid and water to remove bulges on the semiconductor structure;
   patterning the silicon material within the semiconductor structure using a wet etch dilution of a room temperature acid and water and a surface modification chemistry; and
   patterning materials within the semiconductor structure with a reducing strip to decrease the semiconductor structure resistance and remove the surface modification chemistry.

2. The method of claim 1, further comprising having the temperature of the elevated temperature dilution being a range of 60 to 75 degrees Celsius.

3. The method of claim 1, wherein patterning the silicon material within the semiconductor structure using the wet etch dilution of the room temperature acid and water and the surface modification chemistry further comprises:
   having the temperature of the wet etch dilution of the room temperature acid and water being a range of 20 to 25 degrees Celsius; and
   etching the nitride material within the semiconductor structure using a wet etch with a ratio of approximately 300 parts of deionized water to approximately 1 part hydrofluoric acid.

4. The method of claim 1, wherein patterning the nitride material within the semiconductor structure using the wet etch dilution of the elevated temperature of acid and water further comprises using a dilution of an elevated temperature dilution of approximately 2000 parts of deionized water to approximately 1 part acid for patterning the nitride material within the semiconductor structure.

5. The method of claim 1, further comprising beginning performing the room temperature wet etch dilution beginning after the completion of the elevated temperature wet etch dilution.

6. The method of claim 1, further comprising shaping the semiconductor structure into a straight profile with an increased area to deposit capacitor materials.

7. A method comprising:
   etching a silicon material within a semiconductor structure using a wet etch dilution of an elevated temperature of approximately 2000 parts of deionized water to approximately 1 part hydrofluoric acid;
   etching the silicon material within the semiconductor structure using a room temperature wet etch of approximately 300 parts of deionized water to approximately 1 part hydrofluoric acid and surface modification chemistry; and
   performing a reducing strip on materials within the semiconductor structure to decrease the semiconductor structure resistance and remove the surface modification chemistry.

8. The method of claim 7, wherein etching the silicon material within the semiconductor structure comprises etching a high aspect ratio semiconductor structure having silicon layers and a metal layer.

9. The method of claim 8, further comprising forming the nitride layer over the etched silicon and metal layer.

10. The method of claim 8, wherein etching the semiconductor structure comprises etching the high aspect ratio semiconductor structure with a first silicon layer as a semiconductor.

11. The method of claim 8, further comprising etching the semiconductor structure having tungsten as the metal layer.

12. The method of claim 8, wherein etching the silicon material within the semiconductor structure comprises etching the high aspect ratio semiconductor structure with a second silicon layer as a dielectric.

13. The method of claim 7, wherein the reducing strip comprises Oxygen and Hydrogen ($O_2/H_2$).

* * * * *